(12) United States Patent
Naohara et al.

(10) Patent No.: US 10,764,998 B2
(45) Date of Patent: Sep. 1, 2020

(54) ELECTRONIC CIRCUIT BOARD

(71) Applicant: Yazaki Corporation, Tokyo (JP)

(72) Inventors: Masayuki Naohara, Shizuoka (JP); Tomohiro Sugiura, Shizuoka (JP); Yoshihiro Kawamura, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/134,257

(22) Filed: Sep. 18, 2018

(65) Prior Publication Data

US 2019/0150276 A1  May 16, 2019

(30) Foreign Application Priority Data

Nov. 16, 2017  (JP) .................. 2017-220795

(51) Int. Cl.
| | |
|---|---|
| *H05K 1/03* | (2006.01) |
| *H05K 1/09* | (2006.01) |
| *H05K 1/11* | (2006.01) |
| *H05K 1/18* | (2006.01) |
| *H05K 3/30* | (2006.01) |
| *H05K 3/34* | (2006.01) |
| *H05K 5/06* | (2006.01) |

(Continued)

(52) U.S. Cl.
CPC ........... *H05K 1/0278* (2013.01); *H01H 45/04* (2013.01); *H05K 1/181* (2013.01); *H05K 5/0056* (2013.01); *H05K 5/064* (2013.01); *H05K 3/06* (2013.01); *H05K 5/0013* (2013.01); *H05K 5/0047* (2013.01); *H05K 2201/058* (2013.01); *H05K 2201/10053* (2013.01); *H05K 2201/10189* (2013.01); *H05K 2201/10522* (2013.01)

(58) Field of Classification Search
CPC ... H05K 1/03; H05K 1/09; H05K 1/11; H05K 1/18; H05K 3/30; H05K 3/34
USPC ............... 361/749, 115, 729, 736, 752, 826; 174/59, 254, 256, 257, 262; 439/76.2
See application file for complete search history.

(56) References Cited

U.S. PATENT DOCUMENTS 5,478,244 A * 12/1995 Maue .................. B60R 16/0238
                                                              361/752
5,805,402 A *  9/1998 Maue .................. B60R 16/0207
                                                              307/10.1

(Continued)

FOREIGN PATENT DOCUMENTS

| JP | 2003-152286 A | 5/2003 |
|---|---|---|
| JP | 2006-332247 A | 12/2006 |

(Continued)

*Primary Examiner* — Xiaoliang Chen
(74) *Attorney, Agent, or Firm* — Sughrue Mion, PLLC

(57) ABSTRACT

An electronic circuit board includes electronic components to be mounted; a plurality of hard rigid board portions each of which has an insulating insulator and a conductive circuit pattern and electrically connects the mounted electronic component to the circuit pattern; and at least one soft flexible board portion which has an insulating insulator, has a conductive circuit pattern electrically connected to each of the circuit patterns of at least two rigid board portions among the plurality of rigid board portions, and is integrated with the rigid board portions which are electrically connected to the circuit pattern thereof. A plurality of contact relays as the electronic components is dispersedly arranged on the respective rigid board portions.

3 Claims, 9 Drawing Sheets

(51) Int. Cl.
  *H05K 1/02*    (2006.01)
  *H01H 45/04*   (2006.01)
  *H05K 5/00*    (2006.01)
  *H05K 3/06*    (2006.01)

(56) References Cited

U.S. PATENT DOCUMENTS

| | | | |
|---|---|---|---|
| 5,995,380 A * | 11/1999 | Maue | B60R 16/0238 |
| | | | 174/254 |
| 2004/0007379 A1* | 1/2004 | Suzuki | H05K 7/026 |
| | | | 174/59 |
| 2006/0180344 A1* | 8/2006 | Ito | H01L 23/5385 |
| | | | 174/262 |
| 2006/0267180 A1 | 11/2006 | Danjo et al. | |
| 2008/0218984 A1 | 9/2008 | Togashi | |
| 2014/0124262 A1* | 5/2014 | Martin | H01H 71/08 |
| | | | 174/88 R |
| 2014/0125317 A1* | 5/2014 | Baran | H02H 3/08 |
| | | | 324/126 |
| 2014/0126158 A1* | 5/2014 | Baran | H01H 71/08 |
| | | | 361/729 |
| 2015/0009640 A1* | 1/2015 | Stern | H05K 3/30 |
| | | | 361/752 |
| 2015/0135016 A1* | 5/2015 | Glaser | G06F 11/079 |
| | | | 714/37 |
| 2018/0045383 A1* | 2/2018 | Hasegawa | H01L 25/04 |

FOREIGN PATENT DOCUMENTS

| | | |
|---|---|---|
| JP | 2007-53248 A | 3/2007 |
| JP | 2009-071138 A | 4/2009 |
| JP | 2017-022184 A | 1/2017 |
| JP | 2017-022809 A | 1/2017 |

* cited by examiner

FIG.5
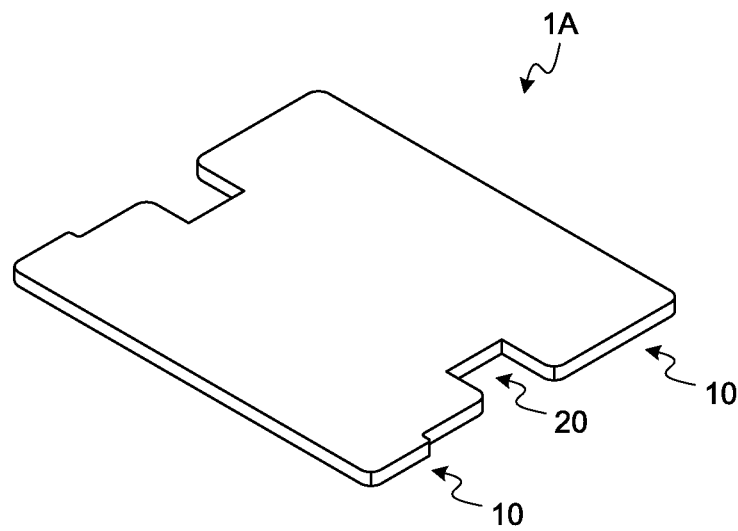
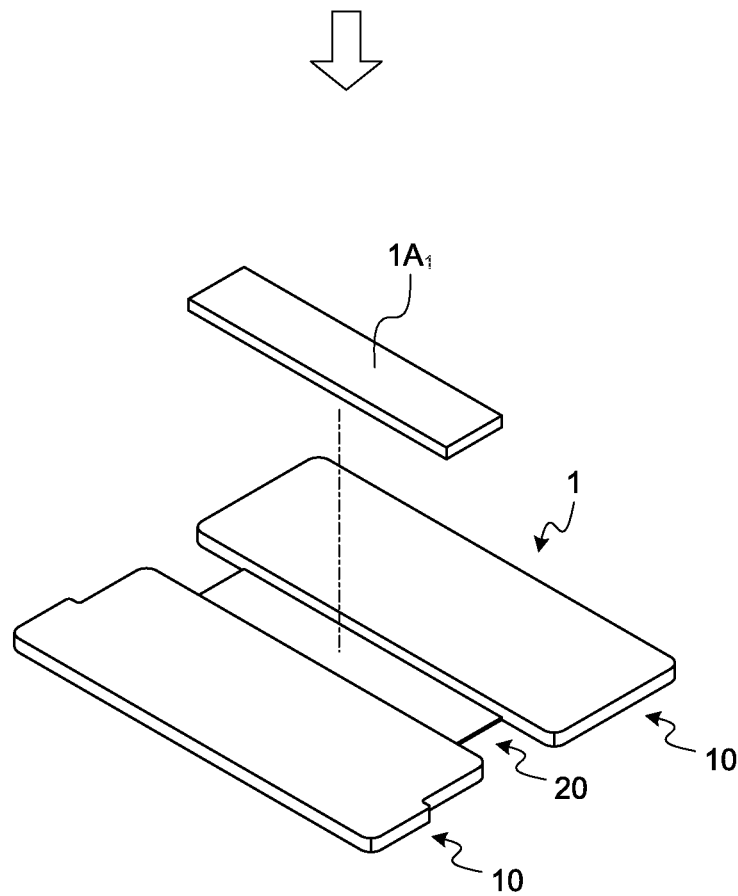

ELECTRONIC CIRCUIT BOARD

CROSS-REFERENCE TO RELATED APPLICATION(S)

The present application claims priority to and incorporates by reference the entire contents of Japanese Patent Application No. 2017-220795 filed in Japan on Nov. 16, 2017.

BACKGROUND OF THE INVENTION

1. Field of the Invention

The present invention relates to an electronic circuit board.

2. Description of the Related Art

Conventionally, as an electronic circuit board, there is known an electronic circuit board which includes a hard insulator and a circuit pattern and on which a plurality of electronic components is mounted in the state of being electrically connected to the circuit pattern. Such a type of electronic circuit board is disclosed, for example, in the following Japanese Patent Application Laid-open No. 2009-71138. As the electronic component mounted on the electronic circuit board, for example, a contact relay (so-called mechanical relay) having a mechanical contact is known. Incidentally, the following JP 2017-22184 A and JP 2017-22809 A disclose electronic circuit boards in which a hard rigid board portion and a soft flexible board portion are integrated.

Meanwhile, when a plurality of contact relays are mounted on one hard insulator in the electronic circuit board, there is a possibility that driving sounds of the respective contact relays resonate depending on a drive timing and a large sound is generated.

SUMMARY OF THE INVENTION

Therefore, a purpose of the present invention is to provide an electronic circuit board capable of suppressing noise caused by driving of a contact relay to be low.

According to an aspect of the present invention, an electronic circuit board includes: a plurality of electronic components to be mounted; a plurality of hard rigid board portions each of which has an insulating insulator and a conductive circuit pattern and electrically connects the mounted electronic components to the circuit pattern; and at least one soft flexible board portion which has an insulating insulator, has a conductive circuit pattern electrically connected to each of the circuit patterns of at least two rigid board portions among the plurality of rigid board portions, and is integrated with the rigid board portions which are electrically connected to the circuit pattern of the flexible board portion. A plurality of contact relays as the electronic components is dispersedly arranged on the respective rigid board portions.

According to another aspect of the present invention, in the electronic circuit board, when a number of the contact relays to be mounted is equal to a number of the rigid board portions, the contact relays may be mounted, one by one, on the respective rigid board portions.

According to still another aspect of the present invention, in the electronic circuit board, when a number of the contact relays to be mounted is smaller than a number of the rigid board portions, the contact relays may be mounted, one by one, on the rigid board portions as many as the number of the contact relays.

According to still another aspect of the present invention, in the electronic circuit board, when a number of the contact relays to be mounted is larger than a number of the rigid board portions, the contact relays may be mounted, one by one, on the respective rigid board portions, and at least one of the contact relays is mounted on each of the rigid board portions as many as a number of the remaining contact relays selected from among the respective rigid board portions.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a perspective view for describing a circuit board intermediate body;

DETAILED DESCRIPTION OF THE PREFERRED EMBODIMENTS

Figure 1:
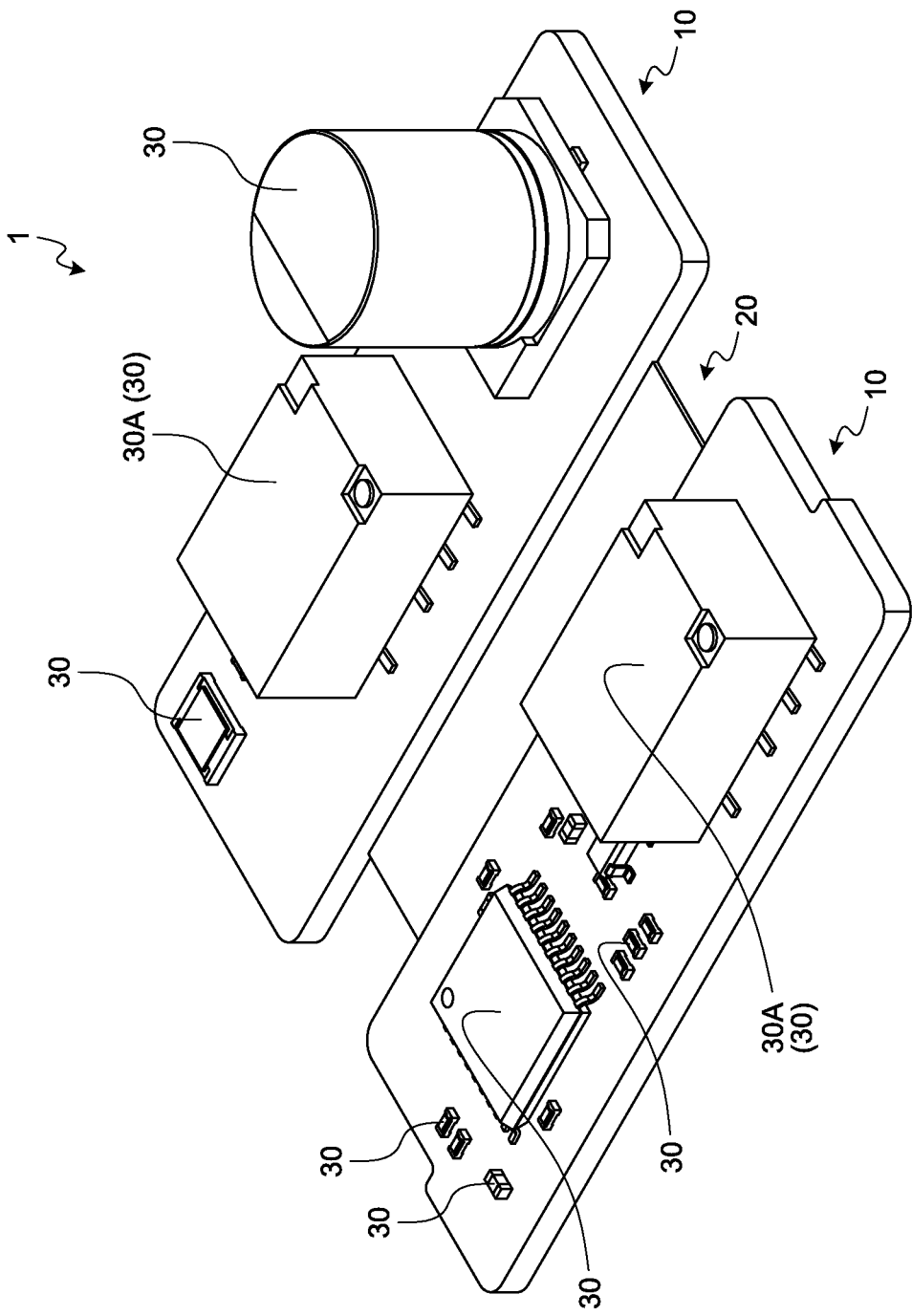
FIG. 1 is a perspective view illustrating an electronic circuit board of an embodiment.

Hereinafter, embodiments of an electronic circuit board according to the present invention will be described in detail with reference to the drawings. Incidentally, the invention is not limited by the embodiments.

EMBODIMENT

One of the embodiments of the electronic circuit board according to the present invention will be described with reference to FIGS. 1 to 9.

Reference numeral 1 in FIGS. 1 to 4 represents an electronic circuit board according to the present embodiment. The electronic circuit board 1 illustrated herein is an example of a so-called printed circuit board (PCB) on which electronic components 30 are mounted. However, the present embodiment does not exclude a so-called printed wiring board (PWB) before the electronic components 30 are mounted.

The electronic circuit board 1 includes a plurality of hard rigid board portions 10, and at least one soft flexible board portion 20 (FIGS. 1 to 4). Further, the electronic circuit board 1 includes the electronic components 30 to be mounted (FIGS. 1 to 4).

Figure 4:
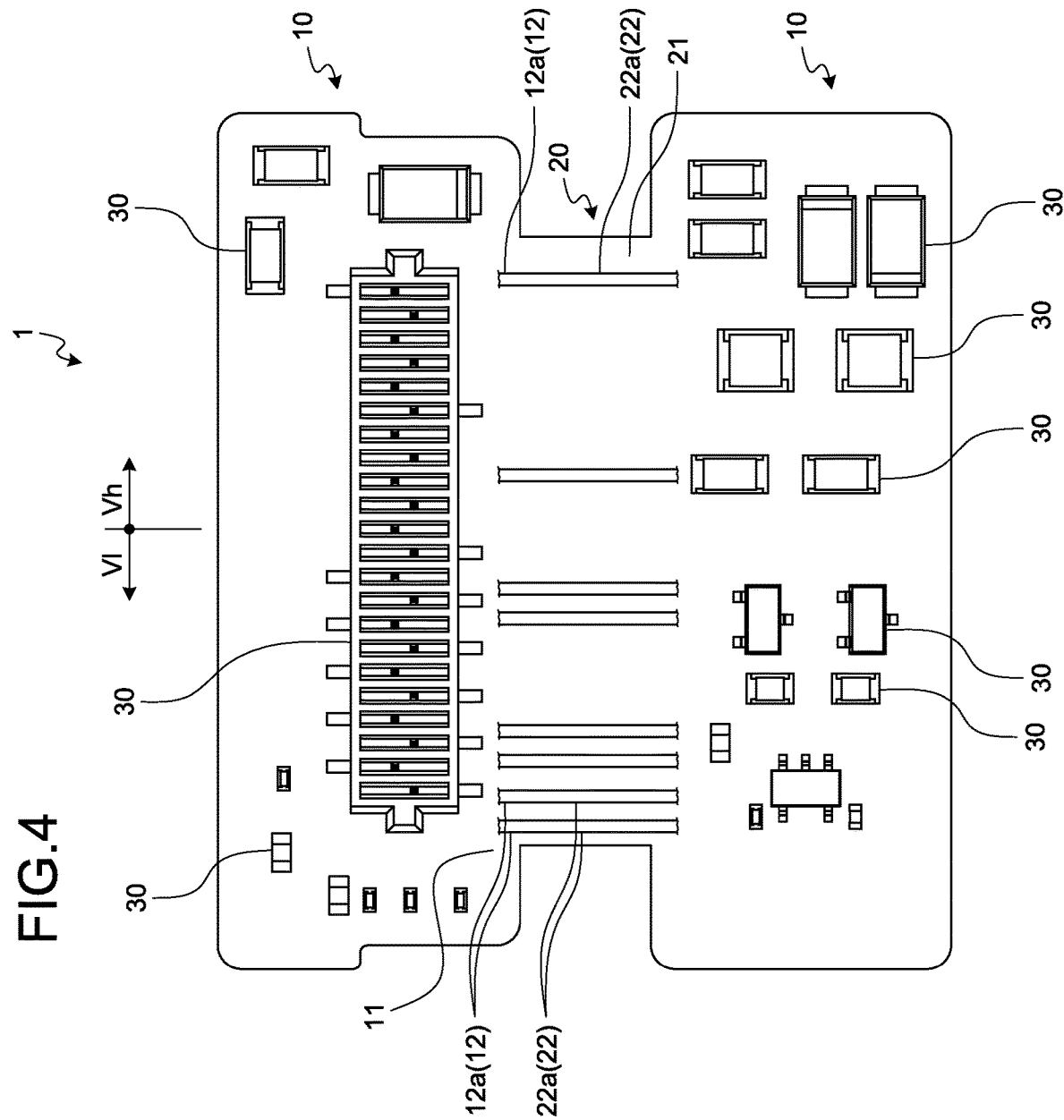
FIG. 4 is a rear view illustrating the electronic circuit board of the embodiment.

The rigid board portion 10 has an insulating insulator 11 and a conductive circuit pattern 12 arranged in layers (FIG. 4).

The insulator 11 is made of an insulating material. The insulator 11 in this example is further divided into a plurality of layers. For example, the insulator 11 includes one hard core layer and a plurality of prepreg layers that is softer than the core layer although not illustrated. The core layer is formed of an insulating material, for example, an epoxy resin, a glass epoxy resin, a paper epoxy resin, ceramics, or the like. On the other hand, the prepreg layer is formed by uniformly impregnating a thermosetting resin (such as epoxy mixed with an additive such as a curing agent) into a fibrous reinforcing material (such as glass cloth and a carbon fiber), and then, turning the resultant into a semi-cured state by heating or drying. Therefore, the prepreg layer is softer than the core layer and has flexibility.

The circuit pattern 12 is formed using a conductive material, for example, by etching processing or the like. The circuit pattern 12 in this example is formed using a copper foil (particularly, a rolled copper foil having better flexibility than an electrolytic copper foil). The circuit pattern 12 is obtained by stretching a plurality of conductive portions 12a (FIG. 4), and the electronic components 30 corresponding to the conductive portions 12a, respectively, are electrically connected thereto. Incidentally, the circuit pattern 12 in this drawing illustrates only some of the conductive portions 12a for convenience of illustration.

In the rigid board portion 10, for example, the circuit pattern 12 is arranged on each plane of the core layer, and the prepreg layer on the inner layer side is stacked on both the planes so as to cover the circuit pattern 12 and a plane of the core layer where the circuit pattern 12 is not arranged. Further, in the rigid board portion 10, another circuit patterns 12 is arranged on each of planes opposite to the core layer side of the prepreg layer on the inner layer side, and another prepreg layer on the outer layer side is stacked on both the planes so as to cover the circuit pattern 12 and a plane of the prepreg layer where the circuit pattern 12 is not arranged. In addition, in the rigid board portion 10, still another circuit pattern 12 is further arranged on each of planes opposite to the core layer side of the prepreg layer on the outer layer side. In this manner, the rigid board portion 10 has a multilayer structure formed of the insulator 11 including the plurality of layers (the core layer and the prepreg layers) and the plurality of circuit patterns 12 divided for each layer. In the rigid board portion 10, the electronic components 30 corresponding to the respective circuit patterns 12 are electrically connected to the circuit patterns 12 as the plurality of electronic components 30 are mounted on both the planes thereof.

Figure 2:
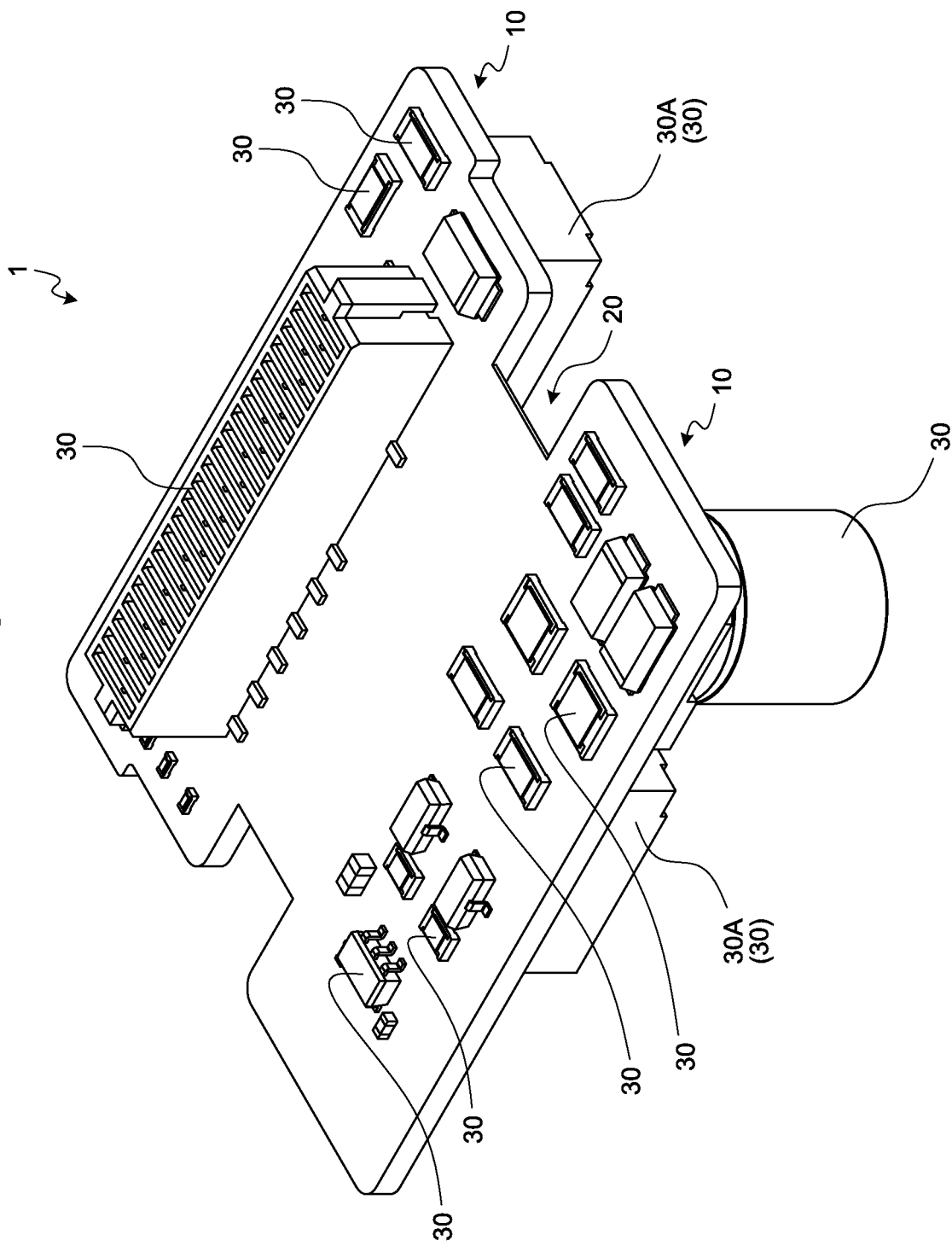
FIG. 2 is a perspective view of the electronic circuit board of the embodiment viewed from another angle.
Figure 3:
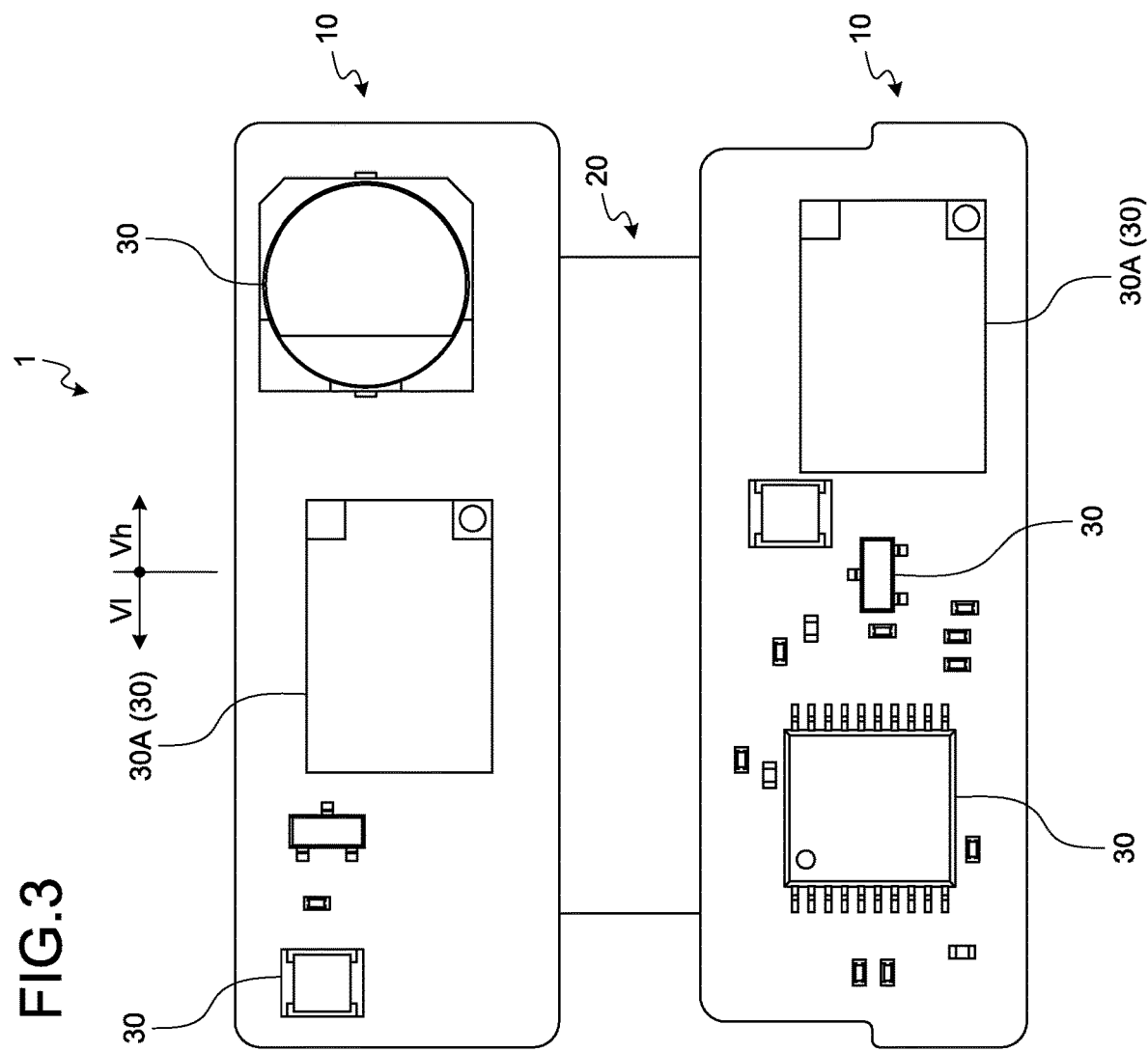
FIG. 3 is a front view illustrating the electronic circuit board of the embodiment.

Here, the electronic components 30 in this example are mounted on each plane of the rigid board portion 10. The electronic component 30 referred to herein indicates, for example, a circuit protection part such as a relay and a fuse, a capacitor, a resistor, a transistor, an intelligent power switch (IPS), a connector, a terminal fitting, an electronic control unit (so-called electronic control unit (ECU)), various sensor elements, a light emitting diode (LED) element, a speaker, and the like. In this example, at least a plurality of contact relays 30A is mounted on the electronic circuit board 1 as the electronic components 30 (FIGS. 1 to 3).

The flexible board portion 20 has an insulating insulator 21 and a conductive circuit pattern 22 arranged in layers (FIG. 4).

The insulator 21 is softer than the insulator 11 of the rigid board portion 10 and has flexibility. Accordingly, the insulator 21 is formed using an insulating material which is softer than the insulator 11 of the rigid board portion 10.

The circuit pattern 22 is formed using a conductive material, for example, by etching processing or the like. The circuit pattern 22 in this example is formed using a copper foil (particularly, a rolled copper foil having better flexibility than an electrolytic copper foil). In the circuit pattern 22, a plurality of conductive portions 22a are stretched (FIG. 4). The circuit pattern 22 in this example is electrically connected to each of the circuit patterns 12 on at least two of the plurality of rigid board portions 10. In the circuit pattern 22, the respective conductive portions 22a are electrically connected to the conductive portions 12a of the respective circuit patterns 12 of the two rigid board portions 10. That is, the circuit pattern 22 in this example serves as a connection conductor that electrically connects the circuit pattern 12 of one rigid board portion 10 with the circuit pattern 12 of the other rigid board portion 10.

The electronic circuit board 1 of the present embodiment is roughly divided into a high-voltage circuit region Vh in which a high-voltage circuit is formed and a low-voltage circuit region Vl in which a low-voltage circuit lower than the high-voltage circuit is formed (FIGS. 3 and 4). Here, each of the rigid board portion 10 and the flexible board portion 20 is divided into the high-voltage circuit region Vh and the low-voltage circuit region Vl. In the electronic circuit board 1, the respective rigid board portion 10 and flexible board portion 20 in the high-voltage circuit region Vh are electrically connected to each other, and the respective rigid board portion 10 and flexible board portion 20 in the low-voltage circuit region Vl are electrically connected to each other.

The rigid board portion 10 and the flexible board portion 20 are integrated in the electronic circuit board 1. For example, the rigid board portion 10 and the flexible board portion 20 integrate the circuit patterns 12 and 22 which are electrically connected to each other. Any method may be used for the integration. For example, in the electronic circuit board 1, the rigid board portion 10 and the flexible board portion 20 may be formed as separate parts, and these parts may be assembled and integrated with each other by connection using a connector, welding (including welding between the circuit patterns 12 and 22), screwing, or the like.

The rigid board portion 10 and the flexible board portion 20 in this example are integrated with each other by being formed on the basis of a circuit board intermediate body 1A including an insulating base material on which a hard insulating layer and an insulating layer softer than the hard insulating layer are stacked and a flexible conductive base material provided on the insulating base material (FIG. 5). In the drawing, the circuit patterns 12 and 22, through-holes, and the like are not illustrate.

The insulating base material is a part to serve as bases of the insulator 11 of the rigid board portion 10 and the insulator 21 of the flexible board portion 20. The insulating base material includes one hard insulating layer and a plurality of soft insulating layers. Each of the insulators 11 of the two rigid board portions 10 is formed of one hard insulating layer and a plurality of soft insulating layers. The insulator 21 of the flexible board portion 20 is formed of one soft insulating layer. The hard insulating layer is formed as the core layer of each of the insulators 11 in the two rigid board portions 10. On the other hand, the plurality of soft insulating layers are formed, respectively, as the plurality of prepreg layers of each of the insulators 11 in the two rigid board portions 10, and one thereof is formed as the insulator 21 of the flexible board portion 20.

The conductive base material is a part to serve as bases of the circuit pattern 12 of the rigid board portion 10 and the circuit pattern 22 of the flexible board portion 20. In the circuit board intermediate body 1A, the flexible conductive base material is formed in a plurality of layers. Each of the plurality of conductive base materials is formed as each of the circuit patterns 12 in each of the two rigid board portions 10, and one thereof is formed as the circuit pattern 22 of the flexible board portion 20.

The circuit board intermediate body 1A is formed as the electronic circuit board 1 by cutting a cut portion 1A₁ so as to leave a soft insulating layer forming the flexible board portion 20 and a conductive base material provided on this insulating layer (FIG. 5). The cut portion 1A₁ includes a hard insulating layer, a soft insulating layer, and a conductive base material which do not serve as constituent elements of the flexible board portion 20. That is, the flexible board portion 20 is formed using a remaining portion, which has been cut from the circuit board intermediate body 1A to leave a soft insulating layer and a conductive base material provided in the insulating layer to form the flexible board portion 20. In this example, the rectangular cut portion 1A₁ is removed from the circuit board intermediate body 1A formed in a substantially rectangular shape. Accordingly, the rectangular flexible board portion 20 is arranged in the state of being integrated between the two substantially-rectangular rigid board portions 10 in the electronic circuit board 1 of this example.

As described above, the electronic circuit board 1 includes the plurality of rigid board portions 10, and the plurality of contact relays 30A is mounted thereon. The plurality of contact relays 30A is opened and closed at the same drive timing or is opened and closed while shifting drive timings from each other. The respective drive timings are determined according to an object to be controlled by the electronic circuit board 1. Accordingly, when the plurality of contact relays 30A is mounted on the single rigid board portion 10 in the electronic circuit board 1, there is a possibility that driving sounds of the respective contact relays 30A resonate depending on the drive timing and a large sound is generated.

Therefore, the plurality of contact relays 30A is dispersedly arranged on the respective rigid board portions 10 (FIGS. 1 to 3). Here, the plurality of contact relays 30A, which cause the mutual driving sounds to resonate when being mounted on the single rigid board portion 10, are at least dispersedly arranged.

Specifically, when the number of the contact relays 30A to be mounted is the same as the number of the rigid board portions 10, the contact relays 30A are mounted, one by one, on the respective rigid board portions 10. As a result, the flexible board portion 20 is interposed between the respective contact relays 30A. Accordingly, interference of the driving sound generated in each of the contact relays 30A is suppressed by the flexible board portion 20 in the electronic circuit board 1, and thus, it is possible to suppress noise caused by driving of the respective contact relays 30A to be low. In this example, the contact relays 30A are mounted, one by one, on the two rigid board portions 10.

In addition, when the number of the contact relays 30A to be mounted is smaller than the number of the rigid board portions 10, the contact relays 30A are mounted, one by one, on the rigid board portions 10, which are as many as the number of the contact relays 30A. For example, it is assumed that the electronic circuit board 1 includes three rigid board portions 10 and two flexible board portions 20 and the flexible board portions 20 are interposed one by one for each combination of a pair of adjacent rigid board portions 10. When the electronic circuit board 1 has two contact relays 30A to be mounted, the contact relays 30A are mounted, one by one, on two rigid board portions selected from among the three rigid board portions 10. As a result, the flexible board portion 20 is interposed between the respective contact relays 30A. Accordingly, even in this case, the electronic circuit board 1 can suppress the noise caused by driving of the respective contact relays 30A to be low.

In addition, when the number of the contact relays 30A to be mounted is larger than the number of the rigid board portions 10, the contact relays 30A are mounted, one by one, on the respective rigid board portions 10, and at least one contact relay 30A is mounted on each of the rigid board portions 10, which are as many as the number of the remaining contact relays 30A, selected from among the respective rigid board portions 10. For example, it is assumed that the electronic circuit board 1 includes two rigid board portions 10 and one flexible board portion 20 as in the present embodiment but the number of the contact relays 30A to be mounted does not coincide with the number of the rigid board portions 10. In this case, the contact relays 30A are mounted, one by one, on the two rigid board portions 10, and the remaining contact relay 30A is mounted on one of the two rigid board portions 10. That is, the two contact relays 30A are mounted on one rigid board portion 10 and the one contact relay 30A is mounted on the other rigid board portion 10 in the electronic circuit board 1. In this case, even if a sound is generated as a result of resonance, the sound can be suppressed to be low although the two contact relays 30A are mounted on the one rigid board portion 10 as compared with the case of mounting the three contact relays 30A on the single rigid board portion 10. In this case, if it is possible to select a combination where the resonance does not occur or hardly occurs from among the plurality of contact relays 30A to be mounted, it may be sufficient to mount the plurality of selected contact relays 30A on the one rigid board portion 10. Accordingly, even in this case, the electronic circuit board 1 can suppress the noise caused by driving of the respective contact relays 30A to be low.

Figure 6:
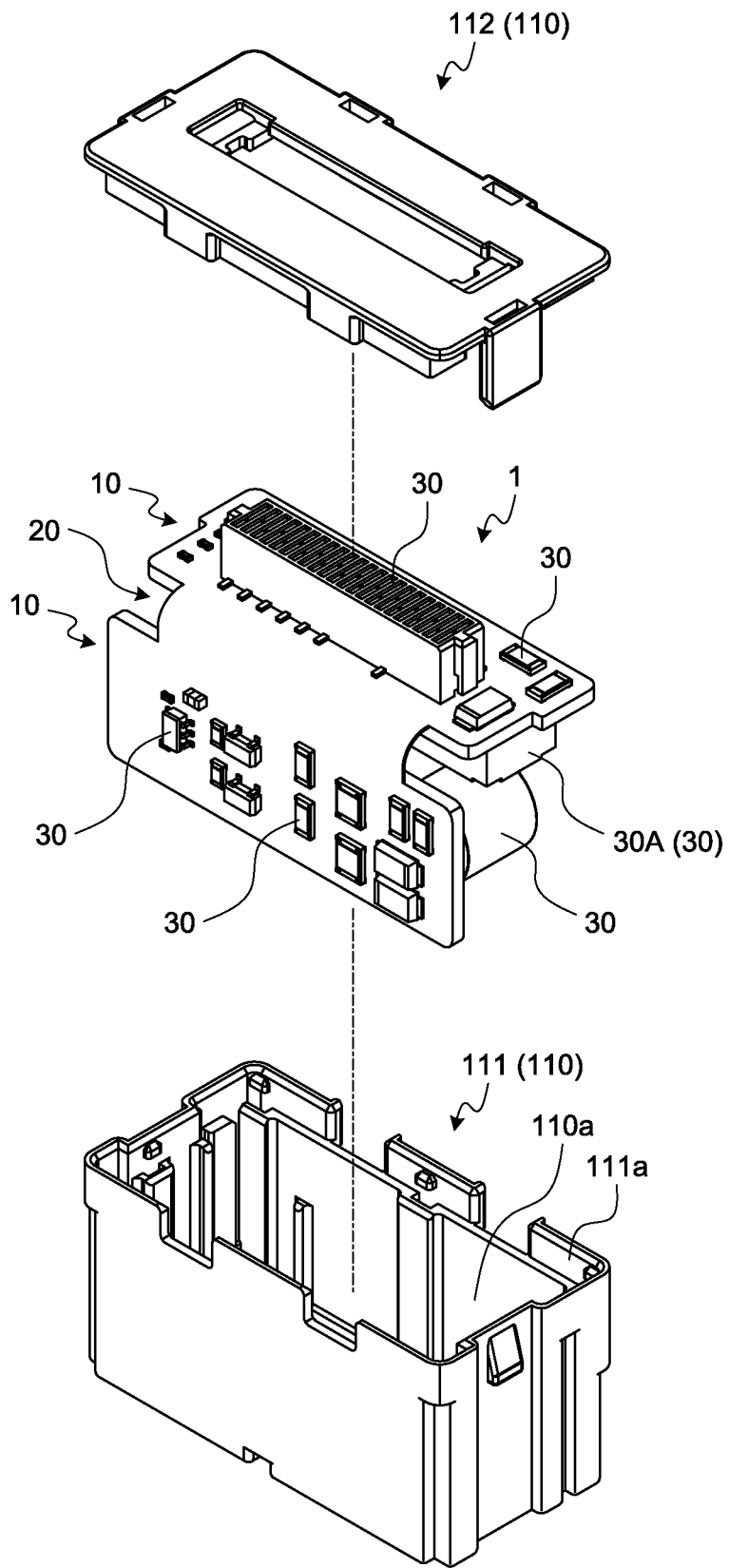
FIG. 6 is an exploded perspective view of an electronic component unit formed of an electronic circuit board and an accommodation box.
Figure 7:
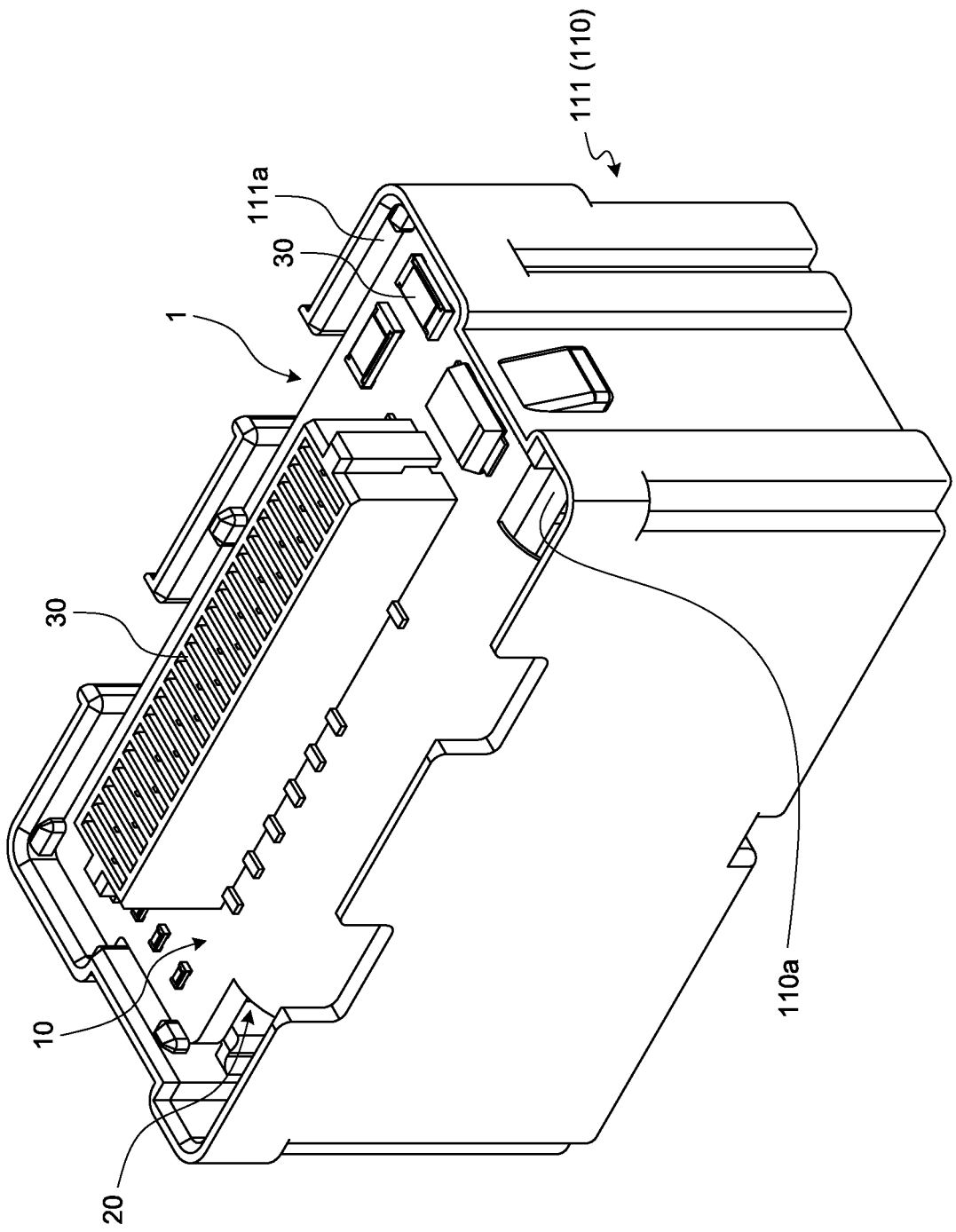
FIG. 7 is a perspective view illustrating an accommodating state of the electronic circuit board in an accommodation chamber, and illustrates a state before injection of a filler.
Figure 8:
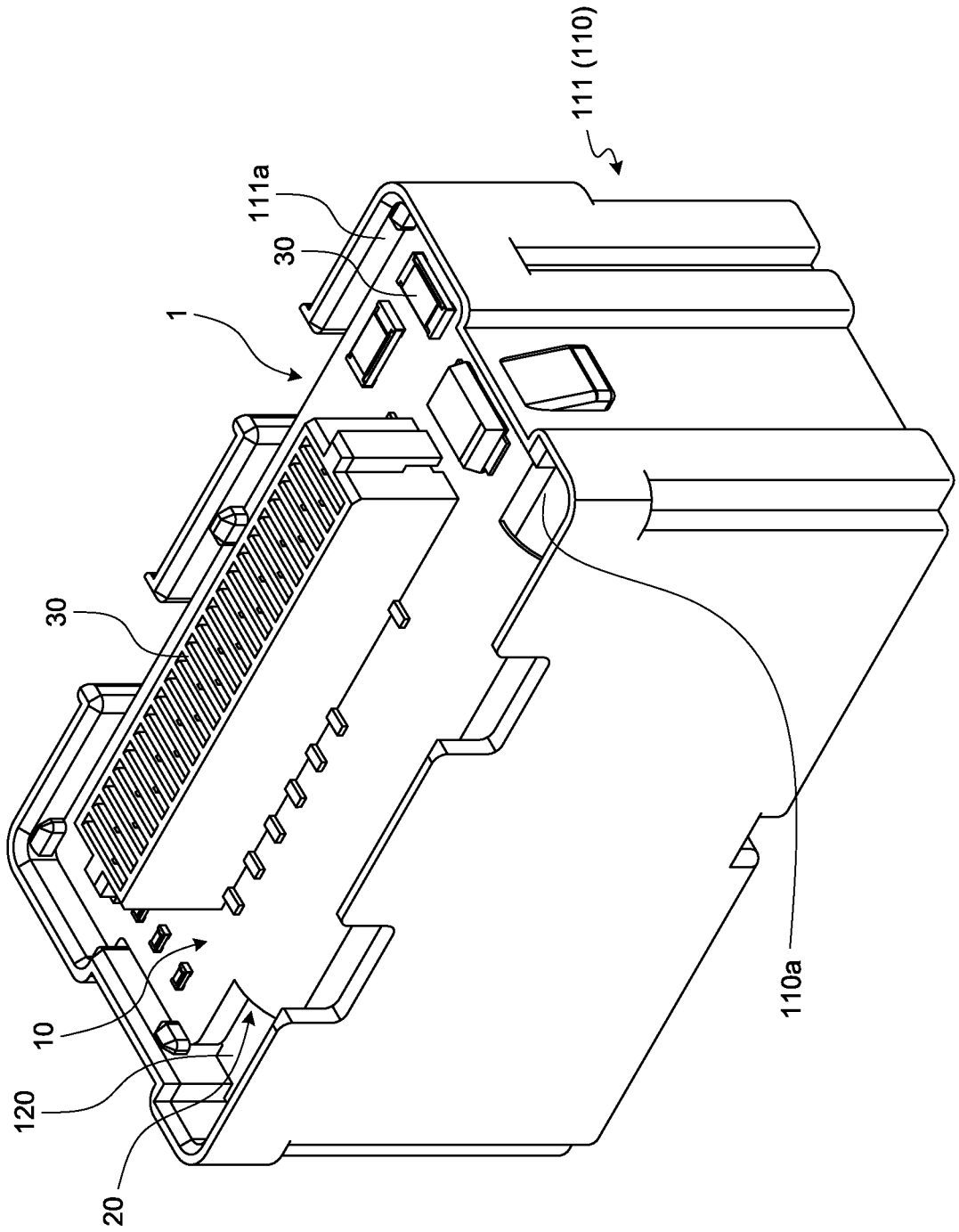
FIG. 8 is a perspective view illustrating the accommodating state of the electronic circuit board in the accommodation chamber, and illustrates a state after injection of the filler.

The electronic circuit board 1 of the present embodiment is bent in an L-shape with the flexible board portion 20 as a boundary and is accommodated in an accommodation chamber 110a of an accommodation box 110 in the bent state (FIGS. 6 to 8).

The accommodation box 110 includes an accommodating member 111 and a cover member 112 (FIG. 6). The accommodating member 111 is a member to serve as the main body in which the accommodation chamber 110a is formed. The accommodating member 111 in this example is formed in a square tubular shape closed at one end, and an inner space thereof is used as the accommodation chamber 110a. A rectangular opening 111a communicating with the accommodation chamber 110a is formed in the accommodating member 111 (FIGS. 6 to 8). The electronic circuit board 1 is accommodated in the accommodation chamber 110a from the opening 111a thereof. The cover member 112 is a member that closes the opening 111a of the accommodation chamber 110a. The cover member 112 is formed in a rectangular shape, and is fixed to the accommodating member 111 in the state of closing the opening 111a.

Figure 9:
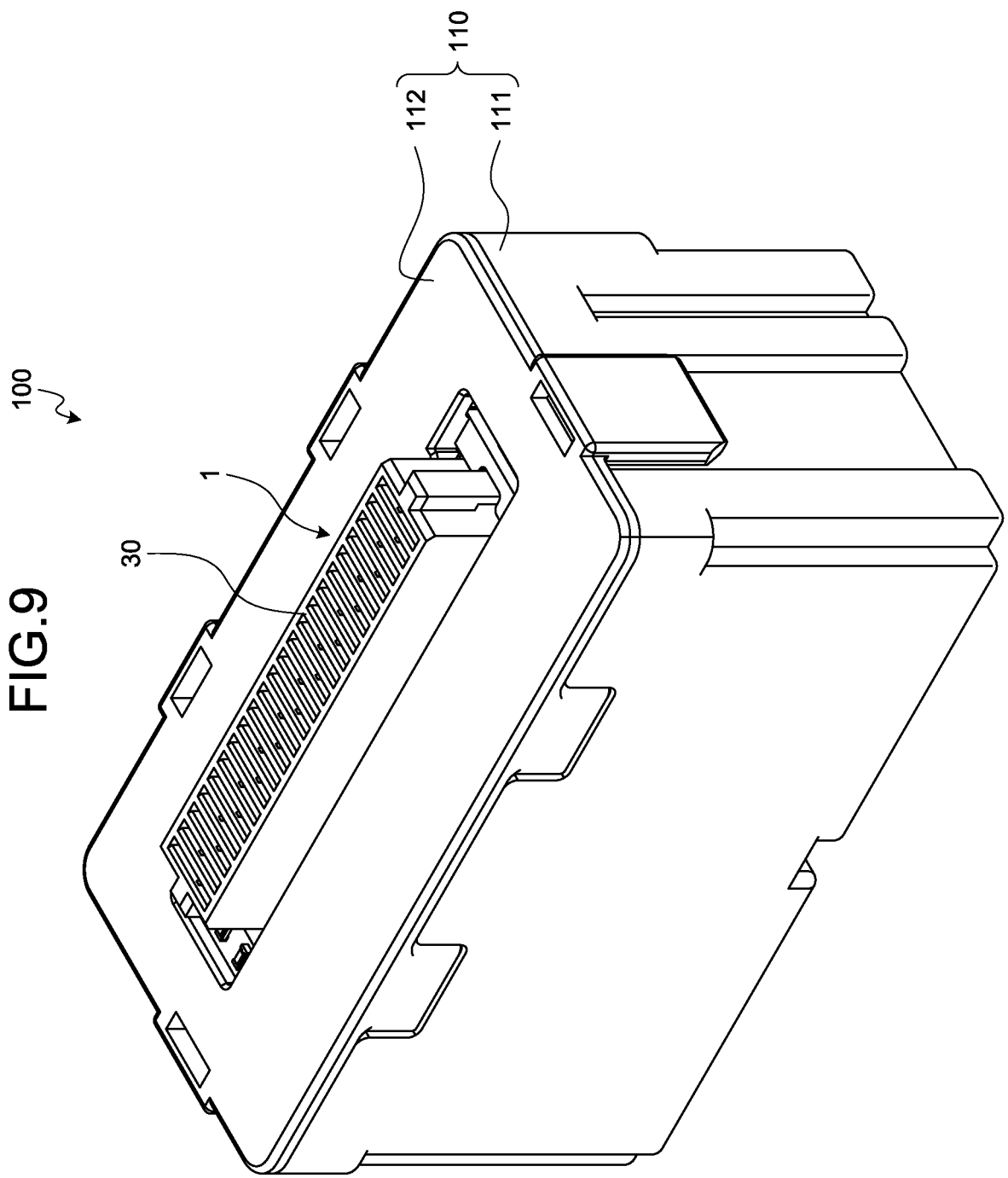
FIG. 9 is a perspective view illustrating the electronic component unit.

Here, the electronic circuit board 1 in the state of being accommodated in the accommodation box 110 is referred to as an electronic component unit 100 (FIG. 9). In the electronic component unit 100, a sealing body 120 is formed in the accommodation chamber 110a by filling the accommodation chamber 110a accommodating the electronic circuit board 1 with a filler in order to secure an insulation property, moisture-proofness, strength, and the like of the electronic circuit board 1 (FIG. 8). As the filler, for example, it is desirable to use a material such as a thermosetting resin that can be cured after filling. However, it is desirable to use a material that can provide flexibility to the cured sealing body 120 as the filler in the electronic component unit 100. For example, a urethane resin is used as the filler herein. As a result, the driving sound of the contact relay 30A can be absorbed by the sealing body 120 in the electronic component unit 100, and thus, it is possible to suppress the noise caused by driving of the respective contact relays 30A to be low.

Since the plurality of contact relays 30A are dispersedly arranged on the plurality of rigid board portions 10 in the electronic circuit board 1 of the present embodiment as described above, it is possible to suppress the noise caused by driving of the respective contact relays 30A to be low. Further, the respective contact relays 30A are covered with the sealing body 120 in the state of being accommodated in the accommodation chamber 110a of the accommodation box 110 in the electronic circuit board 1 of the present embodiment. That is, the sealing body 120 also functions as a sound-absorbing material that absorbs the driving sound of the contact relay 30A. Accordingly, when the electronic circuit board 1 is configured as the electronic component unit 100, it is possible to suppress the noise caused by driving of the respective contact relays 30A to be low.

Since a plurality of contact relays are dispersedly arranged on a plurality of rigid board portions in the electronic circuit board according to the present embodiment, it is possible to suppress the noise caused by driving of the respective contact relays to be low.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic circuit board comprising:
a plurality of electronic components to be mounted;
a plurality of hard rigid board portions each of which has an insulating insulator and a conductive circuit pattern and electrically connects the mounted electronic components to the circuit pattern; and
at least one soft flexible board portion which has an insulating insulator, has a conductive circuit pattern electrically connected to each of the circuit patterns of at least two rigid board portions among the plurality of rigid board portions, and the at least one soft flexible board portion is integrated with the rigid board portions which are electrically connected to the circuit pattern of the flexible board portion,
wherein when a plurality of contact relays in which occurs resonance therebetween or resonance may occur therebetween as the electronic components is mounted, the plurality of the contact relays is dispersedly arranged on the respective rigid board portions, and
wherein when a number of the contact relays to be mounted is larger than a number of the rigid board portions, the contact relays are mounted, one by one, on the respective rigid board portions, and at least one of the contact relays is mounted on each of the rigid board portions as many as a number of the remaining contact relays selected from among the respective rigid board portions.

2. The electronic circuit board according to claim 1,
wherein a first contact relay of the contact relays and a first electronic component of the electronic components are arranged on a same side of a first rigid board portion of the rigid board portions, and
wherein a second contact relay of the contact relays and a second electronic component of the electronic components are arranged on opposite sides of a second rigid board portion of the rigid board portion.

3. An electronic circuit board comprising:
a plurality of electronic components to be mounted;
a plurality of hard rigid board portions each of which has an insulating insulator and a conductive circuit pattern and electrically connects the mounted electronic components to the circuit pattern; and
at least one soft flexible board portion which has an insulating insulator and a conductive circuit pattern,
wherein the conductive circuit pattern is mounted onto the at least one soft flexible board portion and is electrically connected to each of the circuit patterns of at least two rigid board portions among the plurality of rigid board portions,
wherein the at least one soft flexible board portion is integrated with the rigid board portions which are electrically connected to the circuit pattern of the flexible board portion,
wherein a plurality of contact relays as the electronic components is dispersedly arranged on the respective rigid board portions, and
wherein when a number of the contact relays to be mounted is larger than a number of the rigid board portions, the contact relays are mounted, one by one, on the respective rigid board portions, and at least one of the contact relays is mounted on each of the rigid board portions as many as a number of the remaining contact relays selected from among the respective rigid board portions.

* * * * *